United States Patent [19]

Jordan

[11] 4,419,747
[45] Dec. 6, 1983

[54] METHOD AND DEVICE FOR PROVIDING PROCESS AND TEST INFORMATION IN SEMICONDUCTORS

[75] Inventor: Larry T. Jordan, Pleasanton, Calif.

[73] Assignee: Seeq Technology, Inc., San Jose, Calif.

[21] Appl. No.: 346,162

[22] Filed: Feb. 5, 1982

Related U.S. Application Data

[63] Continuation-in-part of Ser. No. 301,592, Sep. 14, 1981, abandoned.

[51] Int. Cl.³ .................... G11C 17/00; G11C 29/00
[52] U.S. Cl. .................................. 365/201; 365/96; 235/492
[58] Field of Search ............... 365/94, 96, 103, 201; 235/380, 381, 382, 487, 492

[56] References Cited

U.S. PATENT DOCUMENTS

| | | | |
|---|---|---|---|
| 3,712,537 | 1/1973 | Carita | 365/201 |
| 3,872,452 | 3/1975 | Stoops | 365/94 |
| 4,344,155 | 8/1982 | Mollier | 365/201 |

OTHER PUBLICATIONS

Wahler, "Using Fusible Links to Apply Machines Readable Serial Numbers to Printed-Circuit Boards," IBM Tech. Disc. Bul., vol. 20. No. 6, 11/77, p. 2286.

*Primary Examiner*—Stuart N. Hecker
*Attorney, Agent, or Firm*—Lyon & Lyon

[57] ABSTRACT

A method and system for encoding key process and test information in semiconductors is disclosed. The invention is particularly useful in connection with byte-wide memories, but also finds application in a wide range of semiconductor devices. A plurality of programmable memory cells are juxtaposed on a semiconductor die with the circuitry which performs the primary function of the chip. The programmable memory cells are interconnected with the primary circuit in such a manner that the information programmed and stored therein can be accessed only when such access does not interfere with the operation of the primary circuit. Important product processing and test information is stored in the programmable cells such as wafer number, lot number, processing parameters, special visual and test results and manufacturing rework data.

20 Claims, 4 Drawing Figures

| FUNCTION | NUMBER OF BITS | BIT POSITION | COMMENTS |
|---|---|---|---|
| PRE-ENCODING | 10 | 1-10 | SECURITY CODE |
| WAFER LOT NUMBER | 14 | 11-24 | UP TO 16,386 LOTS |
| WAFER NUMBER | 6 | 25-30 | UP TO 64 |
| YES/NO, i.e. METAL REWORK | 10 | 31-40 | 10 DISTINCT 1 BIT YES/NO BYTES |
| FEATURE WIDTHS/THICKNESSES | 3 | 41-43 | 8 DIMENSION RANGE BANDS PER 3 BITS |
| ASSEMBLY DATE | 13 | 44-56 | 6 BIT WORK WEEK 7 BIT YEAR |
| TEST DATE | 13 | 57-69 | 6 BIT WORK WEEK 7 BIT YEAR |
| UNASSIGNED | 59 | 70-128 | AVAILABLE FOR USER-SPECIFIED DATA | fig. 4.

METHOD AND DEVICE FOR PROVIDING PROCESS AND TEST INFORMATION IN SEMICONDUCTORS

This application is a continuation in part of application Ser. No. 301,592, filed Sept. 14, 1981, now abandoned.

FIELD OF THE INVENTION

The present invention relates generally to semiconductor devices, and more particularly to methods and apparatus for identifying processing and test details in semiconductors.

BACKGROUND OF THE INVENTION

In the field of electronics, it has long been desirable to be able to identify pertinent processing and test information about particular semiconductor circuits or chips. In some instances, reworked parts are not satisfactory for a customer's use. In memory arrays implemented with redundancy, some customers desire to know whether and where redundancy was used because of pattern sensitivity and other considerations. For some applications, particularly where military or other specialized specifications are to be met, it is useful to know whether certain visual inspections or tests have been performed on the part, or what the results are of critical dimension measurements, such as layer thickness, or other parameter measurements made during the processing of the lot of wafers from which the part is made. However, prior to the present invention, obtaining pertinent and useful processing and test details, such as wafer number, lot number, processing parameters, special visual and test results and manufacturing network data has been difficult if not impossible to obtain because after processing, testing and packaging it is difficult to keep track of particular manufacturing lots in inventory, and records are often fragmented or nonexistent.

Inspections of the package do not directly reveal this information, and are frequently complicated by the presence of adjacent circuitry, lack of identifying marks on the package, coatings or other coverings placed over the chip to assure circuit integrity and other reasons. Even where helpful information such as assembly date is provided on the package, the underlying wafer processing records are often unlocatable, inaccurate or incomplete. Inspections of the chip itself are difficult because of all of the foregoing and most often do not reveal pertinent information. In any event, the package is not intended to be removable, and such removal normally destroys the device.

As a result, there has been a need for a method and device whereby processing and test information could be determined with certainty without the need for reliance on incomplete or difficult to trace paperwork.

SUMMARY OF THE INVENTION

The present invention provides an inexpensive and reliable solution to the foregoing problem, whereby substantial amounts of processing and test information regarding the actual part under consideration may be ascertained by electrically interrogating the semiconductor chip, More specifically, programmable memory cells into which the desired processing and test information can be placed prior to final sort of shipment to a customer are placed on the semiconductor chip adjacent that portion of the chip which performs the primary function of that circuit.

An enable/disable circuit is also included on the chip and serves to disconnect the added memory cells from the primary circuit during normal operation. Similarly, when the user desires to determine the information stored in the memory cells, a signal is provided to the enable/disable circuit which disconnects the primary circuit and permits access to the memory cells containing the desired information. In this manner the product information memory may be electrically connected to the same pins on the chip which provide electrical connection to the primary circuit.

It is one object of the present invention to provide an improved method of providing processing and test information for semiconductor circuits.

It is another object of the present invention to provide an improved, inexpensive and reliable device for providing key processing and test parameters of semiconductor circuits to the user.

It is still another object of the present invention to provide a device and method which permits a user to ascertain processing and test information of semiconductor circuits without need for visual inspection of the chip or resort to examination of processing documents.

It is yet another object of the invention to provide a device and method whereby processing and test for semiconductor circuits can be ascertained through electrical interrogation of the circuit.

These and other objects of the present invention can be better appreciated from the following detailed description of the invention, taken with reference to the appended figures, in which FIG. 1 is a schematic block diagram showing the present invention implemented on an exemplary semiconductor circuit such as a byte-wide memory, FIG. 2 is a schematic representation of an enable/disable circuit suitable for use with the present invention, FIG. 3 is a more detailed logic diagram of an enable/disable circuit suitable for use with the present invention, and FIG. 4 is an exemplary table of typical processing and test information with a suggested format for encoding such information.

DETAILED DESCRIPTION OF THE INVENTION

Figure 1:
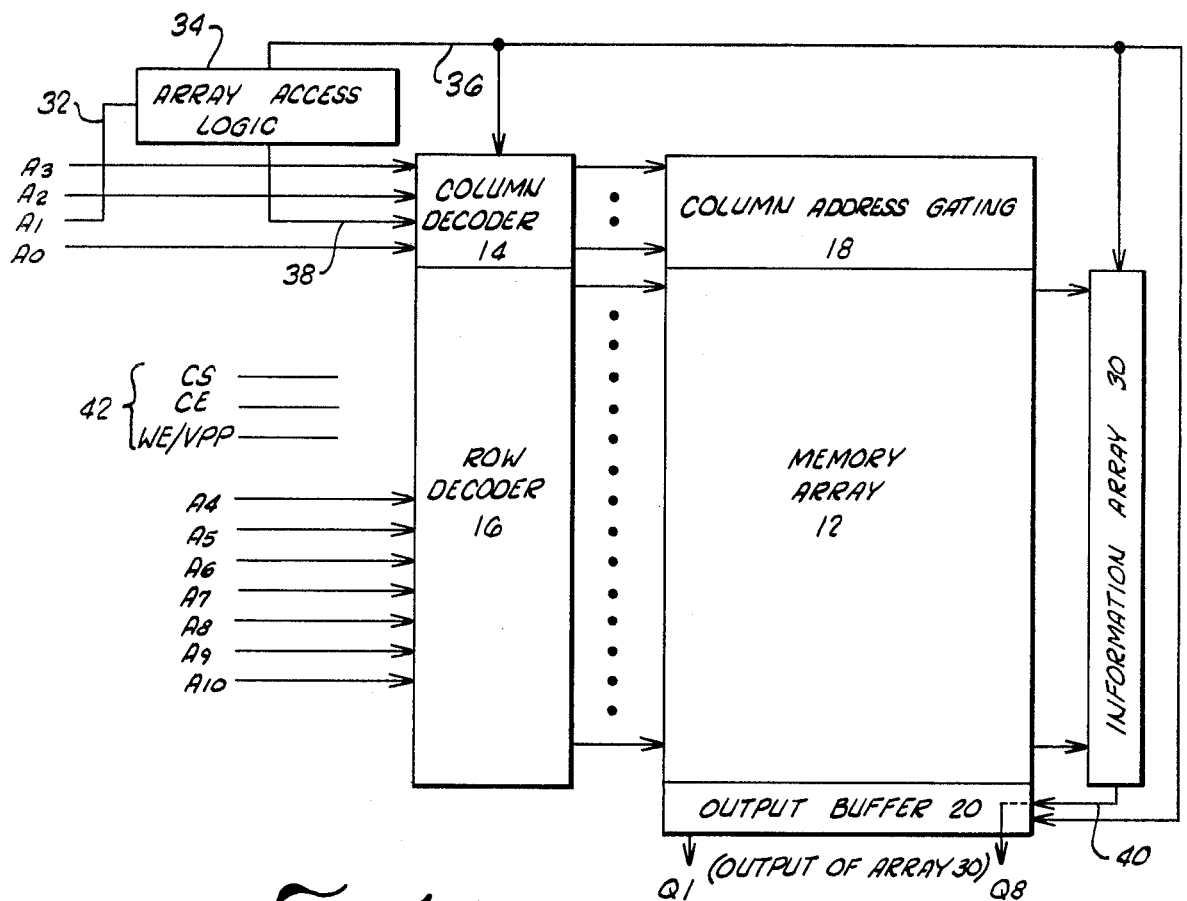

With reference to FIG. 1, there is shown therein an exemplary semiconductor primary circuit 10 with which the present invention can be effectively used. More particularly, the primary circuit 10 may be a device such as an electrically erasable, programmable, read only memory (EEPROM) such as manufactured by a number of semiconductor vendors. The EEPROM may be a 16K device, storing 16K bits of binary information, arranged in a 128-by-128 bit array 12. Thus, each row and each column contains 128 bits of information. As with many other memory devices, that information is organized into groups of bits, referred to as bytes, and simultaneous access is provided to those bits which comprise a selected byte of information. A byte typically comprises eight bits, and this format will be used for purposes of discussion of the present invention herein.

The access to the memory array referred to above is provided through column decoder 14, row decoder 16 and column address gating 18, with the output from the array being presented via an output buffer 20. The column decoder 14 and row decoder 16 are controlled by signals provided to their inputs via address pins A0 through A3 and A4 through A10, respectively. The output of the memory array 12 appears on output pins Q1 through Q8.

In accordance with the present invention, the memory array 12 has been modified to include a processing and test information array 30. The information array 30 is, for the exemplary device shown here, preferably arranged in the format of a single column, to permit serial access to processing and test information stored in array 30, which is configured as a 128×1 bit array. However, it is also possible to incorporate the array 30 in the form of a plurality of columns, or in the form of one or more rows. Those skilled in the art will recognize how to implement such embodiments from the disclosure herein.

The array 30 is preferably a non-volatile memory of the EEPROM type, especially where the primary circuit 10 is a memory device such as an EEPROM or EPROM, since the same processing steps used to fabricate the primary circuit can be used to fabricate the array 30. It must be noted, however, that where the primary circuit is an EPROM erasable by ultraviolet light, EEPROMs or other similar types of non-volatile memory elements cannot be used for array 30 since the information placed in array 30 should not be subject to erasure. In addition, where the primary circuit is very different from the EEPROM or EPROM structures, the extra processing required to fabricate array 30 from these devices makes their use impractical, and other means must be used. In such instances, the present invention may employ other types of memory elements, such as fusible-link devices or laser-blown fuses as are known in the art, for the array 30. Of these, the laser type elements are preferable since they occupy less chip real estate than do fusible-link arrays.

It is neccesary that the data stored in the product information array 30 not interfere with the normal operation of the primary circuit on the chip; i.e., the memory array 12 and associated decoders, gates and buffers. To ensure that undesirable interference does not occur, while at the same time permitting the existing pins to serve dual functions to access the memory array 12 and the information array 30 at the appropriate times, multiple level signals are applied to a selected column address pin. For purposes of this discussion, in which a 16K EEPROM device is exemplary, column address pin A1, indicated as line 32, has been selected to operate with dual functions. When the primary circuit 10 is other than a memory array, any pin may be selected which has access to a convenient location on the die for the array 30.

For conventional operation, conventional TTL signal levels are applied to line 32. However, to access the information array 30, a high voltage signal such as fifteen volts is impressed upon the line 32. To permit the circuitry to distinguish between the conventional TTL signals and the high voltage signal, array access logic 34 is provided as an interface between a column address pin A1 and the column decoder 14 and array 30. The line 32 is thus connected to the access logic 34, which detemines whether a high voltage signal is present.

If the signal on the line 32 is of conventional levels, access to the information array 30 is disabled by means of a signal on a line 36, and the column decoders 14 are conversely enabled thereby. The signal impressed on the line 32 is also supplied to the column decoders 14 on a line 38. However, should the signal on the line 32 be high voltage such as fifteen volts, the logic 34 detects the high signal, disables the column decoder 14, and at the same time addresses the array 30 via line 36. Then, by conventional exercising of the address lines A4 through A10, serial access to the 128 bits of information stored in the array 30 is provided at its output line 40. The information appears in a conventional manner on one of the output pins Q1 through Q8. Array access logic 34 controls output buffers 20 via line 36 as well as array 30. When array access logic 34 has selected array 30, output buffers 20 pass the output line 40 of array 30 through to one of Q1 through Q8. In FIG. 1, output Q8 is shown connected to array 30 via the dotted line extension of line 40.

Figure 2:
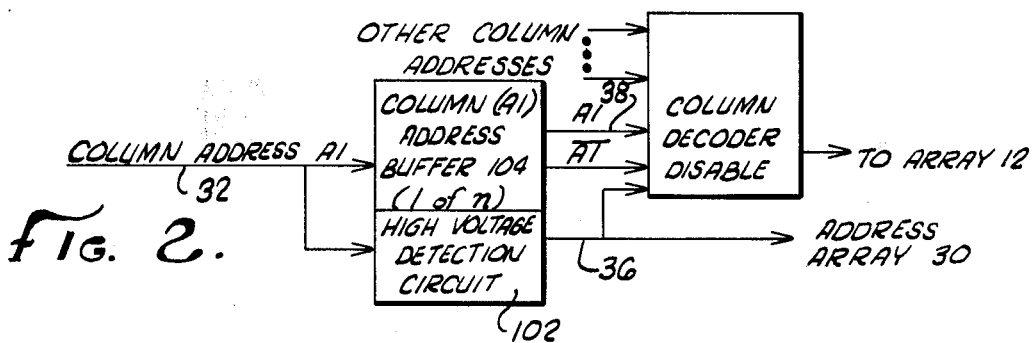

Referring next to FIG. 2, the array access logic 34 is shown in more detail and can be seen to include a high voltage detection circuit 102 and a conventional single bit column address buffer 104 (only one of n shown). The buffer 104 is provided to convert the TTL input signals to MOS logic levels and provides both true and complement outputs to the column decoder 14. The high voltage detection circuit 102 provides an enable/disable signal on the line 38, as shown generally in FIG. 1.

Figure 3:
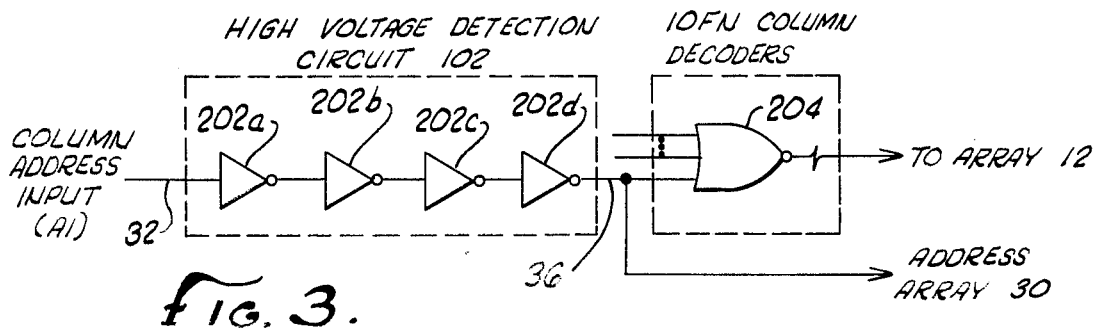

Referring further to FIG. 3, the high voltage detection circuit 102 may be comprised of a string of four inverters 202a through 202d, with the inverter 202a having a suitable threshold for detection of the high voltage signal involved. The signal is then restored to conventional TTL levels through the remaining inverters, such that the output of the inverter 202d may be supplied on the line 38 as a conventional TTL signal to the NOR gates 204 (only one shown) which form the input stage of the column decoder 14. In this manner, the high voltage signal on the line 32 can be seen to cause the column decoder 14 to be disabled from conventional operation, while also addressing the information array 30 to provide the desired process and test information.

It will be appreciated that where the primary circuit is something other than a memory array, such as an operational amplifier, line 32 will not be an address line, and in fact may not be a logic level line at all. In such cases, a spare, normally unused pin on the exterior package may be used to select and deselect array 30 by selectively tying it to ground or to a preselected voltage. If a spare pin is unavailable, line 32 must be carefully selected to prevent selection of array 30 inadvertently by choosing a pin whose normal function could cause the pre-selected array access logic threshold voltage to appear on it.

Where primary circuit 10 is a circuit other than a programmable memory array, no address or programming lines exist. Therefore, array access logic 32, in addition to disabling primary circuit 10, must cause several pins to the exterior package of the product to function as address lines, programming lines, and an output line for array 30 and disconnect such pins from the primary circuit 10. Seven address lines will be needed to address array 30 if it is configured as a 128×1 bit array. The choice of which pins to use will depend on the chip, and similar considerations, and is a matter of design choice to one skilled in the art.

Programming of the array 30 may be understood by again referring to FIG. 1. Where line 38 has been impressed with high voltage to enable array 30 and disable primary circuit 10, and control lines 42 of memory array 12 are properly exercised, as is known in the art, programming of array 30 is accomplished.

Line 36 from array access logic 34 disables all of the outputs except Q8, which it causes to be connected to the output of array 30. In addition, line 36 disables all of the write circuitry associated with Q1 through Q7 of memory array 12 so that only array 30 is programmed. In the preferred embodiment, array 30 is programmed one bit at a time under the control of address lines A4 through A10 and control lines 42 in the usual manner.

It is possible to configure another one of address lines A0, A2 or A3 to enable the writing into array 30 by disabling the write circuitry of memory array 12 associated with Q1 through Q7. A means similar in function to array access logic 34 must be provided to sense high voltage on the selected line and perform this function. Use of this extra line is purely a design choice dictated by the needs of the designer.

As previously noted, array 30 may also consist of fusible-links or laser-blown fuses, keeping in mind that the latter must be fully programmed before the chip is encapsulated and thus may not be able to contain data relative to testing done after encapsulation. Connections for addressing, programming and read-out may be provided by array access circuits 32. Addressing, programming and reading these types of memory devices are all well known in the art, and thus implementation of this invention using such memory schemes will be apparent to those skilled in the art, but generally follows the same scheme as disclosed for the embodiment of FIG. 1.

With reference to FIG. 4, an exemplary format for the information in array 30 is illustrated. In a preferred embodiment, array 30 is arranged as a 128×1 bit array, and the information is thus serially accessed. It is to be noted that the information disclosed as contained in array 30 is for purposes of illustration only, and the present invention is by no means limited to arrays containing this information. Differing requirements will necessarily dictate that different information be placed in array 30.

The type of information which typically will be useful to users and manufacturers of semiconductors includes lot number, wafer number, certain process paramenter data, such as layer thicknesses, assembly data, test data, and data specified by customers for their purposes such as user tracking data for maintenance purposes.

FIG. 4 sets out in table form the data and number of bits for inclusion in a typical array 30. First, ten bits are allocated as a pre-code, which may define the meanings of the bits to follow, in order to provide security for the information contained in array 30. This is useful where the data in array 30 may be sensitive and it is desired to prevent competitors or other unauthorized persons from comprehending the data stored in array 30. The meaning and order of these bits is strictly a matter of design choice.

Fourteen bits are allocated as identification of wafer lot number. Up to 16,384 lot numbers may be identified. Six bits are allocated to identify wafer number, allowing up to 64 wafers to be identified.

Ten bits are assigned to provide yes/no information regarding whether certain tests, such as visual inspection, have been performed, or the metallization has been reworked, etc.

Three bits may be assigned to set forth one of eight ranges for measured thickness or width, such as for polysilicon or oxide layers.

Two groups of six bits and seven bits may be used to identify the work week and year for assembly date and test date.

Of the 128 bits available in array 30, FIG. 4 identifies 69. The other 59 bits may be assigned for customer-supplied or customer specified data to fill particular customer needs. This array size appears to be sufficient to accommodate all information required for most applications, although those skilled in the art will recognize that a larger or smaller array may be used at a cost of more or less chip real estate.

As noted previously, the present invention is particularly applicable to byte-wide memories such as RAMs, EPROMs and EEPROMs, and is preferably implemented in a single column format. However, those skilled in the art, given the teachings herein, will appreciate that the present invention could easily be implemented as a row of cells or several rows of cells. In such an instance, a row address would be selected as the address for the array 30, and the information stored in the array 30 would be read out in parallel fashion by conventional exercising of the column decoders 16.

It will likewise be appreciated that, while the present invention is particularly useful on devices of large die sizes, since little additional real estate is required, the present invention is also useful in ensuring consistency for circuits of smaller die sizes. Thus, for example, in some instances semiconductor users have applications where variations or reworks in processing parameters and related characteristics may have substantial impact upon the suitability of the component for the user's task. However, prior to the present invention, reporting of such changes to the user has not always been complete. With the present invention, such changes may be more readily reported since the information array 30 is programmed at the end of processing and testing and is resident on the device. Thus, where reporting of such processing changes is important, the present invention is also useful with small devices.

Although the pins selected for accessing the array 30 of the exemplary device described in detail above were also conventional input and output pins, other pins may also be suitable for such dual functioning. Thus, any pin whose primary function is such that it need not function at the voltage levels chosen for the selection of the array 30 is suitable, subject to the geometries of the die. Likewise any pins which may receive information from the array 30 without adversely affecting the operation of the primary circuit are suitable for use as output pins for the array 30. While an especially high voltage has been discussed as exemplary for selecting the array 30, it will be appreciated that any other signal which is sufficiently outside the normal range of operating voltages for the primary circuit will be acceptable.

While the foregoing has described in detail one embodiment of the present invention, it will be appreciated that, given the teachings herein, numerous equivalents and alternatives which do not depart from the invention will be apparent to those skilled in the art, and those alternatives and equivalents are intended to be encompassed within the scope of the appended claims.

What is claimed is:

1. A device for providing a user with semiconductor processing and test information relating to a primary circuit disposed upon a semiconductor chip, said device comprising:
- a programmable memory array having a plurality of storage locations disposed on the semiconductor chip adjacent the primary circuit;
- addressing means for accessing selected individual storage locations in said plurality of storage locations;
- programming means for programming semiconductor processing and test information into said selected storage locations accessed by said addressing means; and
- output means for providing output signals representative of the semiconductor processing and test information programmed into said selected individual storage locations accessed by said addressing means.

2. The device of claim 1 wherein said programmable memory array comprises fusible links.

3. The device of claim 1 wherein said programmable memory array comprises laser blown fuses.

4. The device of claim 1 wherein said programmable memory array comprises non-volatile memory cells.

5. The device of claim 1 wherein said addressing means includes logic means for alternately accessing the primary circuit and said programmable memory array.

6. The device of claim 5 wherein the primary circuit is a semiconductor memory having a plurality of storage locations arranged to form a primary memory array and said addressing means is common to said programmable memory array and at least a portion of the primary memory array.

7. The device of claim 6 wherein said addressing means further includes an address pin with a decoder means connected thereto for addressing a predetermined storage location in the primary memory array when a first signal is applied to said address pin and said logic means includes a detection means connected to said address pin for accessing said programmable memory array while simultaneously disabling said decoder means when a second signal is applied to said address pin.

8. The device of claim 6 wherein the primary memory array comprises rows and columns of memory cells and said programmable memory array comprises one of said columns of memory cells.

9. The device of claim 8 wherein said memory cells comprise fusible links.

10. The device of claim 8 wherein said memory cells comprise laser blown fuses.

11. The device of claim 8 wherein said memory cells comprise non-volatile memory cells.

12. The device of claim 6 wherein the primary memory array comprises rows and columns of memory cells and said programmable memory array comprises one of said rows of memory cells.

13. The device of claim 12 wherein said memory cells comprise fusible links.

14. The device of claim 12 wherein said memory cells comprise laser blown fuses.

15. The device of claim 12 wherein said memory cells comprise non-volatile memory cells.

16. A device for providing a user with semiconductor processing and test information relating to a primary memory array having storage locations disposed upon a semiconductor chip, said device comprising:
- a secondary programmable memory array having a plurality of storage locations disposed on the semiconductor chip adjacent the primary memory array;
- addressing means for accessing the storage locations in the primary memory array and for the alternately accessing said plurality of storage locations in said secondary programmable memory array;
- programmable means for selectively programming said semiconductor processing and test information into said plurality of storage locations in said secondary programmable memory array when said addressing means accesses said plurality of storage locations in said secondary programmable memory array; and
- output means for providing output signals representative of said information programmed into said plurality of storage locations in said secondary memory array.

17. A device for providing a user with semiconductor processing and test information relating to a primary memory array having storage locations disposed upon a semiconductor chip, said device comprising;
- a secondary programmable memory array having a plurality of storage locations disposed on the semiconductor chip adjacent the primary memory array;
- addressing means for accessing the storage locations in the primary memory array and for alternately accessing said plurality of storage locations in said secondary programmable memory array;
- programming means for selectively programming said semiconductor processing and test information into said plurality of storage locations in said secondary programmable memory array when said addressing means accesses said plurality of storage locations in said secondary programmable memory array; and
- output means for providing a first set of output signals representative of the information programmed into the storage locations in the primary memory array and for alternately providing a second set of output signals representative of said information programmed into said plurality of storage locations in said secondary memory array.

18. A device as set forth in claim 17 wherein said addressing means includes a logic means for generating a signal which accesses said secondary programmable memory array while disabling the primary memory array and which simultaneously connects said output means to said secondary programmable memory array.

19. A method for providing semiconductor processing and test information relating to a primary memory array in a semiconductor device having a programmable non-volatile storage means formed thereon adjacent to said primary array and also having an addressing means formed thereon for alternately accessing said primary memory array and said programmable non-volatile storage means, said method comprising the steps of:
- accessing said programmable non-volatile storage means;
- programming into said non-volatile storage means selected semiconductor processing and test information relating to said primary circuit; and
- retrieving said selected information from said storage means on demand.

20. A method as set forth in claim 19, further including the step of disabling said primary memory array when said programmable non-volatile storage means is accessed.

* * * * *